United States Patent [19]

Hamm et al.

[11] Patent Number: 4,939,102

[45] Date of Patent: Jul. 3, 1990

[54] METHOD OF GROWING III-V SEMICONDUCTOR LAYERS WITH HIGH EFFECTIVE HOLE CONCENTRATION

[75] Inventors: Robert A. Hamm, Staten Island, N.Y.; Roger J. Malik, Summit, N.J.; Morton B. Panish, Springfield, N.J.; John F. Walker, Westfield, N.J.

[73] Assignee: American Telephone and Telegraph Company, New York, N.Y.

[21] Appl. No.: 297,716

[22] Filed: Jan. 17, 1989

[51] Int. Cl.[5] .......................................... H01L 21/203
[52] U.S. Cl. .............................. 437/107; 148/DIG. 2; 148/DIG. 41; 148/DIG. 56; 148/DIG. 169; 156/612; 437/31; 437/96; 437/971
[58] Field of Search ................. 148/DIG. 2, DIG. 41, 148/DIG. 56, 65, 57, 110, DIG. 169; 156/610-614; 427/248.1, 252, 255.1; 437/81, 95, 96, 31, 105, 107, 110, 126, 129, 133, 939, 946, 971, 949

[56] References Cited

U.S. PATENT DOCUMENTS 4,248,675 2/1981 Bozler et al. ............................ 357/30
4,330,360 5/1982 Kubiak et al. ........................ 156/610
4,383,872 5/1983 Roberts ................................ 437/107

OTHER PUBLICATIONS

"Metalorganic CVD of GaAs in a Molecular Beam System", by E. Veuhoff et al., *Journal of Crystal Growth*, 55 (1981), pp. 30–34.

"Heavily Si-Doped InGaAs Lattice-Matched to InP Grown by MBE", by T. Fujii et al., *Electronics Letters*, vol. 22, No. 4, Feb. 13, 1986, pp. 191–192.

"Application of Molecular-Beam Epitaxial Layers to Heterostructure Lasers", by H. C. Casey, Jr. et al., *IEEE Journal of Quantum Electronics*, vol. QE-11, No. 7, Jul. 1975, pp. 467–470.

"Molecular Beam Epitaxy", by A. Y. Cho et al., *Progress in Solid-State Chemistry*, vol. 10, Part 3, pp. 157–191.

*Primary Examiner*—Brian E. Hearn
*Assistant Examiner*—Bunch: William
*Attorney, Agent, or Firm*—Eugen E. Pacher

[57] ABSTRACT

36 We have discovered the III-V semiconductor layers with previously unattainably high effective hole concentrations can be produced by molecular growth processes (e.g. MBE) if an amphoteric dopant such as Be is used and if, during the growth of the highly doped III-V layer, the substrate is maintained at a temperature $T_g$ that is substantially lower than customarily used. For instance, a InGaAs layer with effective hole concentration $1.0 \times 10^{20}$ cm$^{-3}$ was grown at $T_g = 450°$ C., and a GaAs layer with effective hole concentration of $1.0 \times 10^{20}$ cm$^{-3}$ was grown at $T_g$ of 475° C. The heavily doped III-V layers can be of device grade and can usefully be part of electronic devices such as high speed bipolar transistors.

6 Claims, 3 Drawing Sheets

METHOD OF GROWING III-V SEMICONDUCTOR LAYERS WITH HIGH EFFECTIVE HOLE CONCENTRATION

FIELD OF THE INVENTION

This invention pertains to methods of producing semiconductor devices, and to devices produced thereby. In particular, the inventive method comprises a deposition process, exemplarily an MBE-type process, for forming a p-type III-V semiconductor layer.

BACKGROUND OF THE INVENTION

Processes for forming a semiconductor layer, including compound semiconductor layers such as InP, InAs, GaAs, AlGaAs, InGaAs, GaInAsP and InGaAlAs layers, that comprise exposing a substrate in an evacuated chamber to an appropriate flux of molecules are well known. These processes will be generically referred to as molecular beam epitaxy (MBE) processes. See, for instance, Cho et al, *Progress in Solid State Chemistry*, Vol. 10, pp. 157–191 (1975). Various variants of the basic MBE process are also known. See, for instance, U.S. Pat. No. 4,330,360, and E. Veuhoff et al., *Journal of Crystal Growth*, Vol. 55, pp. 30–34. Among variants that are of interest herein are metal-organic MBE (MOMBE) and gas source MBE (also known as hydride source MBE). Compound semiconductor layers can also be produced by methods that involve contacting a substrate with an atmosphere that comprises precursor molecules. Exemplary of these processes is metal-organic chemical vapor deposition (MOCVD). These processes, together with MBE processes, will collectively be referred to as molecular growth processes.

It is general practice that during MBE deposition the substrate is maintained at an elevated temperature, since the quality of MBE-produced material frequently tends to improve with increasing substrate temperature $T_g$, at least up to some upper limit that typically depends on the material. See, for instance, H. C. Casey et al., *IEEE Journal of Quantum Electronics*, QE11, p. 467 (1975). It is also well known that a III-V or other compound semiconductor material typically experiences a temperature-dependent loss of constituents when heated in a vacuum, the dependence of the loss rate of a given constituent on the temperature typically being exponential, and the loss rates for different constituents typically being different. In other molecular growth processes the substrate is also maintained at elevated temperature.

MBE deposition processes not only can be used to produce undoped but also doped compound semiconductor material. Doped material is typically produced by exposing a substrate to a flux of molecules that comprises, in addition to the constituents of the compound semiconductor, one or more dopant species. It is generally believed that the maximum effective carrier concentration that is attainable in device-grade III-V semiconductor material is determined by the solubility limit of the dopant species in the III-V material at the deposition temperature. Since typically the solubility increases with increasing temperature, this implies that the maximum possible effective carrier concentration increases with increasing substrate temperature during deposition of the doped III-V material.

Recently it has been reported that the maximum attainable electron concentration in Si-doped InGaAs increases with decreasing substrate temperature. T. Fujii et al., *Electronics Letters*, Vol. 22(4), p. 191 (1986). For instance, at substrate temperatures of 370° C. and 420° C. maximum electron concentrations of $6.1 \cdot 10^{19}$ and $5.0 \cdot 10^{19}$ cm$^{-3}$, respectively, were achieved. The previously reported maximum value was $1.5 \cdot 10^{19}$ cm$^{-3}$, achieved at a substrate temperature of 500° C., a conventional growth temperature.

Si is an important n-type dopant for III-V semiconductor materials. As is well known, it is an amphoteric dopant in these materials, that is to say, it locates in both lattice positions, the one normally occupied by the column III element or elements, and the one normally occupied by the column V element or elements. Since Si is an electron donor in III-V semiconductor material it however preferentially locates in the former lattice sites, and the effective electron concentration is determined by the difference between the Si occupancy of the two sites. This is exemplified by FIG. 2 of Fujii et al., which shows a much faster than linear decrease of the electron mobility as a function of effective electron concentration in Si-doped InGaAs, for concentrations above about $10^{19}$ cm$^{-3}$, indicative of a total Si concentration that increases faster than the effective electron concentration.

Group II p-type dopants for III-V materials typically are non-amphoteric and thus can be expected to interact with the host lattice differently from amphoteric dopants. However, an ability to produce highly doped p-type device-grade III-V semiconductor material would be highly desirable For instance, it has recently been discovered that the inelastic scattering rate in such material can be much lower than previously thought, making possible an improved hot electron transitor. See U.S. patent application Ser. No. 241,279, entitled "Hot Electron Bipolar Transistor", filed Sept. 7, 1988 for A. F. J. Levi. See also U.S. patent application Ser. No. 250,790 entitled "Bipolar Hot Electron Transistor", filed Sept. 28, 1988 for Y. Chen et al., which discloses a very fast transistor comprising, inter alia, a thin p+ base layer (n=$5 \times 10^{19}$ cm$^{-3}$). Both of these applications are co-assigned with this and are incorporated herein by reference.

Since the operating speed (and possibly other characteristics) of III-V transistors could be improved if it were possible to produce device-grade III-V semiconductor material that has a higher effective hole concentration than could heretofore be produced, it would be highly desirable to have available a method for producing such material. This application discloses such a method.

Throughout this application we will refer to some ternary and quaternary III-V materials in a manner that has become conventional in the art. For instance, any material of composition $In_xGa_{1-x}As$ will be referred to as InGaAs (to be read "indium gallium arsenide"), regardless of the value of x. The absence of numerical subscripts is thus not intended to imply the presence of one molar unit of each constituent element.

SUMMARY OF THE INVENTION

Disclosed is a method of producing a semiconductor device comprising a first single crystal semiconductor region and a single crystal layer of III-V semiconductor material in contact and epitaxial with the first region. The latter will be referred to as the "III-V layer". This terminology is not meant to imply that the device comprises only one layer that consists of III-V material, and we specifically contemplate device structures that comprise a multiplicity of epitaxial layers consisting of III–V material, typically formed on a III–V single crystal substrate.

In devices according to the invention the III–V layer comprises a dopant species which imparts p-type conductivity to at least a portion of the layer. The inventive method of producing such a device comprises providing the first semiconductor region, forming the III–V layer thereon, and completing producing the semiconductor device by processes known to those skilled in the art. The first semiconductor region can in principle be all or part of a semiconductor wafer, e.g., an InP wafer, but more likely is a layer of III–V semiconductor material epitaxially grown on an appropriate substrate wafer, or possibly on an intermediate layer. In any case, the first semiconductor region can be produced by processes known to those skilled in the art.

At least the III–V layer is produced by a molecular growth process, preferably by a process that comprises exposing the first semiconductor region to a flux of molecules (optionally also comprising one or more atomic species) comprising at least one element from column III of the periodic table (e.g., Al, In, Ga), at least one element from column V (e.g., P, As, Sb), and the dopant species (e.g., a column II element such as Be). Significantly, the dopant species is non-amphoteric, i.e., it exhibits a strong preference for one of the two possible lattice sites of the III–V layer material, typically the site associated with the column III element or elements. Be and Zn are exemplary non-amphoteric p-type dopants that can be used in the practice of the invention.

Associated with the III–V layer material (and the deposition process) is a temperature $T_v$ at which the rate of loss from the III–V layer material of one of the constituents of the III–V material is 1% of the arrival rate of that constituent at the surface of the III–V layer during the deposition process, with the rate of loss of all other constituents of the III–V layer material being less than 1% of the arrival rate of the respective constituents. Although $T_v$ is not necessarily the highest temperature at which useful prior art product can be deposited, deposition at a substrate temperature $> T_v$ requires critical flux adjustments due to the exponential variation of the loss rate as a function of temperature and thus has not been commonly employed in the prior art, particularly not for III–V layers in which composition is critical to obtaining a lattice match between the growing layer and the underlying semiconductor material. InGaAs is such a layer material. The temperature at which the substrate (and thus the first semiconductor region) is maintained during formation of the III–V layer is to be referred to as the substrate temperature $T_g$. If desired, $T_g$ need not be constant throughout the time required for deposition of the III–V layer.

Associated with the III–V layer material is also a maximum effective hole concentration $N_o$ (determinable by, for instance, a standard Hall effect measurement) obtainable if $T_g = T_v$. It is to be understood that, as is the case throughout this discussion, we are concerned only with single crystal material of a quality useful for device applications. $N_o$ thus is the maximum effective hole concentration in the relevant device-grade III–V layer material deposited at a substrate temperature $T_g = T_v$. As is known to those skilled in the art, $N_o$ typically is close to (but typically not exceeding) the solubility limit at $T_v$ of the dopant species in the III–V layer material. It is also known that solubility limits generally are temperature dependent, typically decreasing with decreasing temperature.

We have discovered that, contrary to expectations based on the prior art, it is possible to attain effective hole concentrations in the III–V layer material that are substantially greater than $N_o$ (at least about $2N_o$, typically $\gtrsim 1 \times 10^{20}$ cm$^{-3}$) if the substrate temperature is selected to be substantially less than $T_v$, and the inventive method comprises such choice of $T_g$. This choice can result in a dopant concentration that we believe to be substantially in excess of the equilibrium solubility limit at $T_g$ of the dopant species in the III–V material, while at the same time substantially preserving the crystalline quality of the material, such that the resulting highly p-type III–V layer is device-grade material. Such highly doped layers are of considerable device interest, e.g., as base layer in very high speed InP-based bipolar transistors. Furthermore, we have found that use of $T_g$ substantially below $T_v$ (and therefore substantially lower than in prior art processing) makes possible the attainment of extremely abrupt changes in doping level. For instance, in Be-doped GaAs grown by MBE with $T_g$ of 500° C., and having an effective hole concentration of about $3 \times 10^{20}$ cm$^{-3}$, we have been able to produce a doping profile showing a significant change in Be-concentration (e.g., by more than a factor of 100) over a distance much less than 10 nm. Abrupt doping profiles are desirable in at least some electronic devices (e.g., some high speed bipolar transistors), and we consider the ability to produce such abrupt profiles to be a significant advantage of the inventive method.

It will be appreciated that the appropriate $T_g$ depends, inter alia, on the III–V material that is to be grown. For instance, for equal hole concentrations $T_g$ for GaAs will typically be substantially higher than for InGaAs.

Although MBE processes are currently preferred in the practice of the invention, the invention is not necessarily limited to the use of MBE processes. In particular, if MOCVD could be developed to be operable at the low temperatures that are required for the practice of the invention then MOCVD could and advantageously be used.

DETAILED DESCRIPTION

Although we currently believe that the invention can be embodied in substantially any III–V semiconductor material, the discussion below is generally in terms of GaInAs and, to a lesser extent, GaAs. No limitation is thereby implied.

Figure 1:
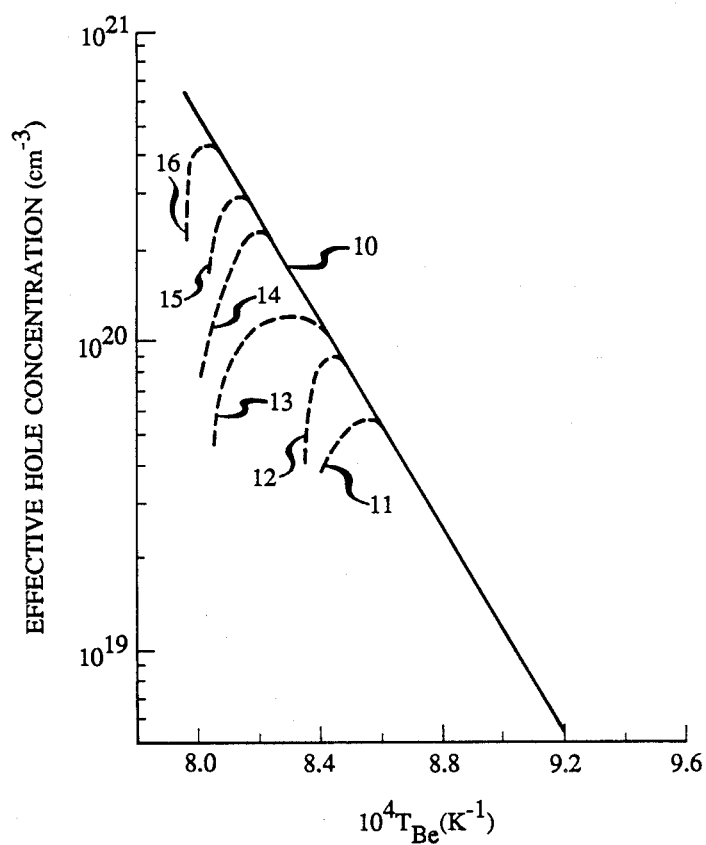
FIG. 1 presents exemplary data on the effective hole concentration versus the inverse dopant effusion cell temperature for Be-doped GaInAs for several substrate temperatures.

FIG. 1 shows data on the effective hole concentration of Be-doped GaInAs; as a function of the parameter $10^4/T_{Be}$, where $T_{Be}$ is the absolute temperature of the Be effusion cell. The parameter is thus inversely related to the flux of dopant atoms that arrive at the growth surface. The figure presents data for seven substrate temperatures, ranging from 502° C. to 366° C. The substrate was an InP single crystal wafer.

Figure 2:
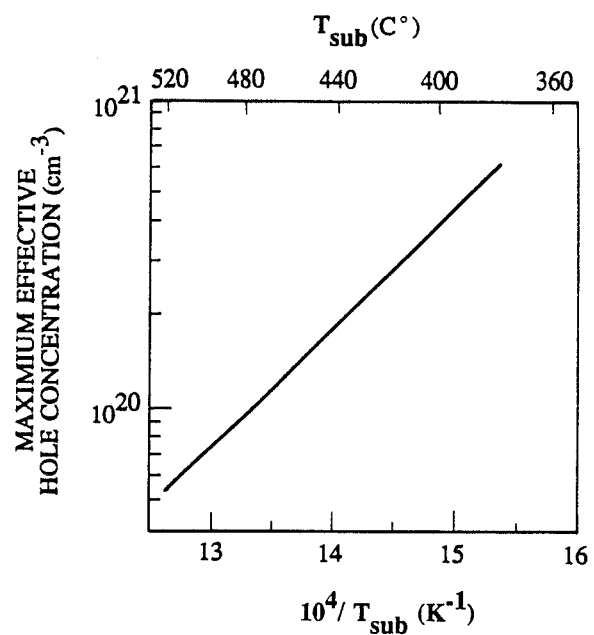
FIG. 2 shows exemplary results for the maximum effective hole concentration in Be-doped GaInAs as a function of substrate temperature.

For relatively small values of $T_{Be}$ (corresponding to a relatively small flux of Be), the results for all substrate temperatures tend to lie on a universal curve, namely, straight line 10. Associated with a given substrate temperature is a value of $T_{Be}$ above which the effective hole concentration does no longer lie on curve 10 but instead decreases with increasing $T_{Be}$. That value of $T_{Be}$ is an inverse function of substrate temperature as shown in FIG. 2. Curves 11–16 in FIG. 1 are for substrate temperatures 502°, 475°, 448°, 434°, 411°, 389° and 366° C., respectively.

We currently interpret the results shown in FIG. 1 to indicate that, for values of the effective hole concentration that lie on universal curve 10, essentially each acceptor atom that is incorporated into the III–V material contributes a hole to the effective hole concentration, and that, for values that do not lie on curve 10, not every acceptor atom contributes a hole. The latter is thought to indicate the formation of microscopic precipitates. As will be appreciated by those skilled in the art, generally only doped material that lies on curve 10 is acceptable for device applications. Prior art deposition of Be-doped GaInAs was generally carried out with the substrate at about 500° C., which corresponds approximately to $T_y$ in this material. The maximum attainable effective hole concentration under prior art conditions is about $6 \times 10^{19}$ cm$^{-3}$, as can be seen from FIG. 1.

FIG. 2 shows the maximum effective hole concentration for Be-doped GaInAs as a function of $T_g$. As shown, reduction of $T_g$ from the prior art value of about 500° C. to 366° C. results in an almost ten-fold increase in the maximum attainable effective hole concentration.

Figure 3:
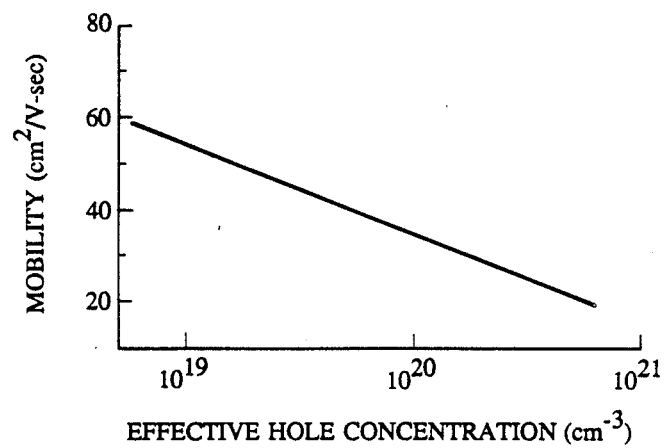
FIG. 3 presents exemplary data on the mobility in Be-doped GaInAs as a function of the effective hole concentration.

FIG. 3 gives the hole mobility observed in Be-doped GaInAs as a function of the effective hole concentration. Those skilled in the art will appreciate that the results presented suggest that acceptor concentrations in excess of the solubility limit at the relevant $T_g$ can be obtained by means of the inventive method.

The physics underlying our unexpected discovery is not yet fully understood. However, we currently believe that, when forming a III–V layer according to the invention, the group III and V constituents of the material are relatively mobile on the surface, such that device-grade single crystal material can result. On the other hand, the non-amphoteric dopant atoms are believed by us to be relatively immobile on the surface. Since arrival sites of the dopant atoms are randomly distributed, it is believed that relatively few dopant atoms will encounter another dopant atom on the surface before they find, and bond to, the many available substitutional sites, and that consequently few microprecipitates of dopant atoms are formed. Lowering the temperature reduces the surface mobility of the dopant atoms. The probability of their remaining in a substitutional site is enhanced, while the probability of encountering another dopant atom is decreased. This results in a concentration of dopant atoms in substitutional sites that substantially exceeds the conventional equilibrium solubility limit of the dopant species in the III–V material, and a much smaller concentration of dopant atoms incorporated into microprecipitates. The upper limit of effective hole concentration (at a given $T_g$) is believed to occur when the size or number of the microprecipitates exceeds a critical limit, causing the crystal to relax and form dislocations associated with the microprecipitates. These dislocations are thought to become sites for further dopant precipitation. The above theoretical discussion is offered only as a possible aid to the understanding of the inventive method, and is not meant to limit in any way the claimed invention. If this theoretical view is correct the curves of FIGS. 1–3 can be expected to depend somewhat on the growth rate of the epitaxial layers.

The inventive method comprises also a variety of conventional steps such as providing means for making electrical contact with the highly p-doped III–V layer and with at least one other region of the multilayer inventive semiconductor device such that an electrical current can be caused to flow between the III–V layer and the first semiconductor region. The manufacture of inventive devices typically involves such well known techniques as preparation of an appropriate semiconductor wafer to serve as substrate for the epitaxial growth of semiconductor layers thereon, the epitaxial growth of such layers, deposition of metallization layers, patterning of various layers, e.g., by means of lithography and etching, contacting of various metallized regions, and encapsulation of the device or devices.

The inventive method can be advantageously employed in the production of a variety of semiconductor devices. The devices can be discrete but in many cases will be part of an integrated circuit. Exemplarily the inventive method is used to produce a high speed bipolar transistor. A device according to the invention typically comprises a multiplicity of regions including a first single crystal semiconductor region and a single crystal layer of III–V material thereon. The latter is heavily doped with a non-amphoteric p-type dopant such that in at least a portion of the III–V layer the effective hole concentration is greater than $5 \times 10^{19}$ or even $10^{20}$ cm$^{-3}$. The device further comprises means for making electrical contact to the III–V layer and to at least one other of the multiplicity of regions such that an electrical current can be caused to flow between the first semiconductor region and the III–V layer.

In a currently preferred embodiment the inventive device is an InP-based bipolar transistor in which the III–V layer is InGaAs and the dopant is Be. The III–V layer is the base of the transistor, the first semiconductor region is part of the collector, and a region overlying the III–V layer is part of the emitter.

Figure 4:
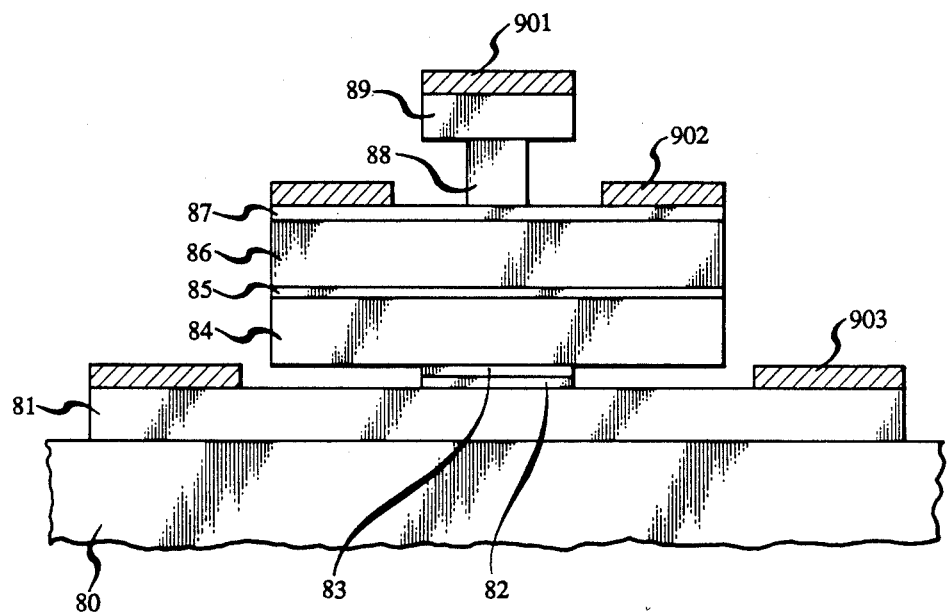
FIG. 4 is a schematic representation of an exemplary device according to the invention, a bipolar transistor.

FIG. 4 schematically depicts an exemplary bipolar transistor according to the invention that resembles a transistor disclosed in the above referred to U.S. patent application Ser. No. 250,790, differing from the latter at least in regard to the effective hole concentration in base layer 87. In FIG. 4, numeral 80 refers to a substrate, (exemplarily an InP wafer), 81 to a collector contact layer (exemplarily 250 nm n+ InGaAs), 82, 83, 84 and 85 to etch stop layers (exemplarily 50 nm InP, 50 nm InGaAs, 300 nm InP, 50 nm InGaAs, respectively; all four layers being n+). Furthermore, numeral 86 refers to the collector depletion layer (exemplarily 300 nm n− InGaAs), the base layer (87) is exemplarily 50 nm InGaAs (35 nm being p+, $2 \times 10^{20}$ cm$^{-3}$, the remainder not being intentionally doped), 88 refers to the emitter layer (exemplarily 300 nm n InP), and 89 to the emitter contact layer (exemplarily 200 nm n+ InGaAs). All layers referred to as InGaAs exemplarily have composition $In_{0.53}Ga_{0.47}As$. The n-type dopant exemplarily is Si except for the n-type dopant in the InP emitter and the emitter contact layer which is Sn. The base dopant exemplarily is Be. Layers 901, 902, and 903 are self-aligned metal contacts, which permit making electrical contact with emitter, base, and collector respectively.

The structure of FIG. 4 can be produced substantially as described in the '790 U.S. patent application, except that exemplarily the substrate temperature during deposition of the doped portion of 87 is about 420° C. and the Be source temperature is about 930° C.

As is well known to those skilled in the art, in the growth of some III–V materials such as $In_xGa_{1-x}As$ by MOMBE the composition of the resulting material depends on the growth temperature. In such a case it may frequently be advantageous not to vary $T_g$ during a deposition run and to carry out all of the temperature-sensitive deposition at the low growth temperature appropriate for attainment of the high hole concentration according to the invention. In such a case it may be advantageous to grow part of the structure at a relatively low growth rate to obtain high quality layers.

EXAMPLE 1:

In a structure substantially as shown in FIG. 4, the Be-doped $In_{0.53}Ga_{0.47}As$ base layer was grown as follows. The substrate, a InP wafer with previously deposited layers thereon, was at 450° C. in an MBE chamber. Beams of In, Ga, and $As_2$ were caused to impinge on the top surface of the substrate, the fluxed adjusted to result in the desired composition and a growth rate of 1 μm/hour. The Be source was maintained at 910° C., and the resulting Be beam allowed to impinge on the surface for about 126 seconds. Be-doping was then terminated but the growth of the base layer was continued for about 54 seconds, resulting in an intentionally doped base layer region of about 35 nm thickness (effective hole concentration about $1\times10^{20}$ cm$^{-3}$) and a not intentionally doped base layer region of about 15 nm thickness. The base layer growth was terminated by stopping the In and Ga beams, and the growth of the InP emitter layer was initiated by switching from $As_2$ to $P_2$ and then restarting the In beam. A flux of Sn was also allowed to impinge on the growth surface during the growth of the emitter layer. The resulting structure was epitaxial and of device grade.

EXAMPLE 2:

A further structure substantially as shown in FIG. 4 is grown substantially as described in Example 1, except that during the growth of the last intermediate layer (which is part of the collector) the temperature is decreased from 500° C. to about 420° C., the latter temperature reached simultaneously with the start of the growth of the intentionally doped portion of the base layer. The Be source is maintained at 930° C., resulting in an effective hole concentration of $2.0\times10^{20}$ cm$^{-3}$. After completion of the growth of the 35 nm thick intentionally doped portion of the base layer the substrate temperature was again increased such that the InP emitter layer is grown between about 435° and 450° C. The resulting structure is epitaxial and of device grade.

EXAMPLE 3:

A heteroepitaxial structure from which a bipolar transistor can be prepared by standard techniques was grown as follows. A GaAs semi-insulating single crystal substrate was heated to 630° C. in a vacuum of about $10^{-8}$ Torr to thermally desorb the native oxides thereon. The substrate was then maintained at 600° C. and a 0.5 μm thick layer of Si-doped ($5\times10^{18}$ cm$^{-3}$) GaAs grown by MBE, followed by a 0.3 μm thick layer of more lightly Si-doped ($1\times10^{17}$ cm$^{-3}$) GaAs. These two layers were intended to serve as subcollector and collector, respectively, in the transistor. The growth rate throughout this run was 1.2 μm/hr. Three minutes before the end of the collector growth the substrate temperature was ramped down to 475° C. Upon completion of the collector growth the Si source is shut off and a Be source is turned on, the Be flux adjusted to result in a dopant concentration of $1\times10^{20}$ cm$^{-3}$. The Be source is left on 4 minutes, resulting in the growth of a 0.08 μm thick device grade, very heavily doped GaAs layer that was intended to serve as base layer in the transistor. At the end of the base layer growth the substrate temperature was rapidly ramped up to 630° C., the Be source turned off and an Al source and the Si source turned on, with the fluxes adjusted such that the resulting material was of composition $Al_{0.3}Ga_{0.7}As$, Si doped to $5\times10^{17}$ cm$^{-3}$. After 5 minutes the Al flux was turned off and the Ga, $As_2$, and Si fluxes adjusted such that the resulting GaAs had a dopant level of $5\times10^{18}$ cm$^{-3}$. The AlGaAs layer was 0.1 μm thick and was intended to serve as emitter layer, the GaAs was 0.2 μm thick and was intended to serve as emitter contact layer.

We claim:

1. A method of producing a semiconductor device comprising a first single crystal semiconductor region and a single crystal layer of III–V semiconductor material epitaxial with the first semiconductor region and comprising a non-amphoteric dopant species which imparts p-type conductivity to at least a portion of the layer of III–V material; the method comprising (a) providing the first semiconductor region;

(b) forming the layer of III–V material by a deposition process comprising contacting the first semiconductor region with a flux of molecules and/or atoms or an atmosphere comprising precursor molecules, the flux comprising at least one column III element, at least one column V element, and the dopant species, with the first semiconductor region at a predetermined growth temperature $T_g$; associated with the III–V material and the deposition process being a temperature $T_v$ at which the rate of loss from the III–V material of one of the constituents of the III–V material is 1% of the arrival rate of that constituent at the surface of the III–V material during the deposition process, with the rate of loss of all other constituents of the III–V material being less than 1% of the arrival rate of the respective constituents; associated with the III–V material being a maximum effective hole concentration in the material obtainable if $T_g=T_v$, this hole concentration to be designated $N_o$; and (c) completing producing the semiconductor device; CHARACTERIZED IN THAT the method further comprises (d) selecting $T_g$ to be at least 50° C. less than $T_v$, and such that the effective hole concentration in at least a portion of the III–V material is at least about $10^{20}$ cm$^{-3}$.

2. Method of claim 1, wherein the deposition process is a molecular beam epitaxy process.

3. Method of claim 2, wherein the III–V material is selected from the group consisting of InP, InAs, GaAs, AlGaAs, InGaAs, GaInAsP, and InGaAlAs, and wherein the non-amphoteric dopant species is Be.

4. Method of claim 2, wherein the device comprises an InP substrate, wherein the first semiconductor region is an InGaAs intermediate layer epitaxial with the substrate, wherein the III-V layer is an InGaAs layer and the non-amphoteric dopant species is Be, wherein $T_g$ is selected such that the effective hole concentration in at least a portion of the III-V layer is at least about $1 \times 10^{20}$ cm$^{-3}$, and wherein (c) comprises forming at least one InGaAs overlayer on said InGaAs layer.

5. Method of claim 2, wherein the device comprises a GaAs substrate, wherein the first semiconductor region is a GaAs intermediate layer epitaxial with the substrate, wherein the III-V layer is a GaAs layer and the non-amphoteric dopant species is Be, wherein $T_g$ is selected such that the effective hole concentration in at least a portion of the III-V layer is at least about $1 \times 10^{20}$ cm$^{-3}$, and wherein (c) comprises forming at least one AlGaAs overlayer on said GaAs layer.

6. Method of claim 3, wherein the III-V material is InGaAs.

* * * * *